United States Patent [19]
Suzumura et al.

[11] 3,962,687
[45] June 8, 1976

[54] METHOD OF INSPECTION OF SEMICONDUCTOR MEMORY DEVICE

[75] Inventors: Yoshikazu Suzumura, Fuchu; Yoichi Asano, Setagaya; both of Tokyo, Japan

[73] Assignee: Hitachi, Ltd., Japan

[22] Filed: Oct. 15, 1974

[21] Appl. No.: 514,927

[30] Foreign Application Priority Data
Oct. 12, 1973  Japan.............................. 48-113896

[52] U.S. Cl...................... 340/173 R; 340/173 BB; 340/172.5
[51] Int. Cl.²......................................... G11C 13/00
[58] Field of Search.................. 340/173 BB, 173 R

[56] References Cited
UNITED STATES PATENTS

| | | | |
|---|---|---|---|
| 3,222,653 | 12/1965 | Rice............................. | 340/173 BB |
| 3,336,579 | 8/1967 | Heyman....................... | 340/173 BB |
| 3,541,525 | 11/1970 | Gange........................... | 340/173 BB |
| 3,633,268 | 1/1972 | Engbert........................ | 340/173 BB |
| 3,800,294 | 3/1974 | Lawlor......................... | 340/173 BB |
| 3,813,650 | 5/1974 | Hunter......................... | 340/173 BB |

*Primary Examiner*—Terrell W. Fears
*Attorney, Agent, or Firm*—Craig & Antonelli

[57] ABSTRACT

In a method of inspection of a semiconductor memory device, selection signals for selecting a memory cell to be tested and a designation signal for designating the address of a predetermined memory cell are compared, to produce a mask instruction signal when the address of the memory cell to be tested is coincident with the address of the predetermined memory cell, and the judgment of the test result of the predetermined memory cell is masked by the mask instruction signal. If the predetermined memory cell is one known to be inferior during the wiring check, it will be also defection during the test of any characteristic. Since such memory cells with inferior wiring are masked in characteristic tests, the analysis of defects is facilitated.

2 Claims, 8 Drawing Figures

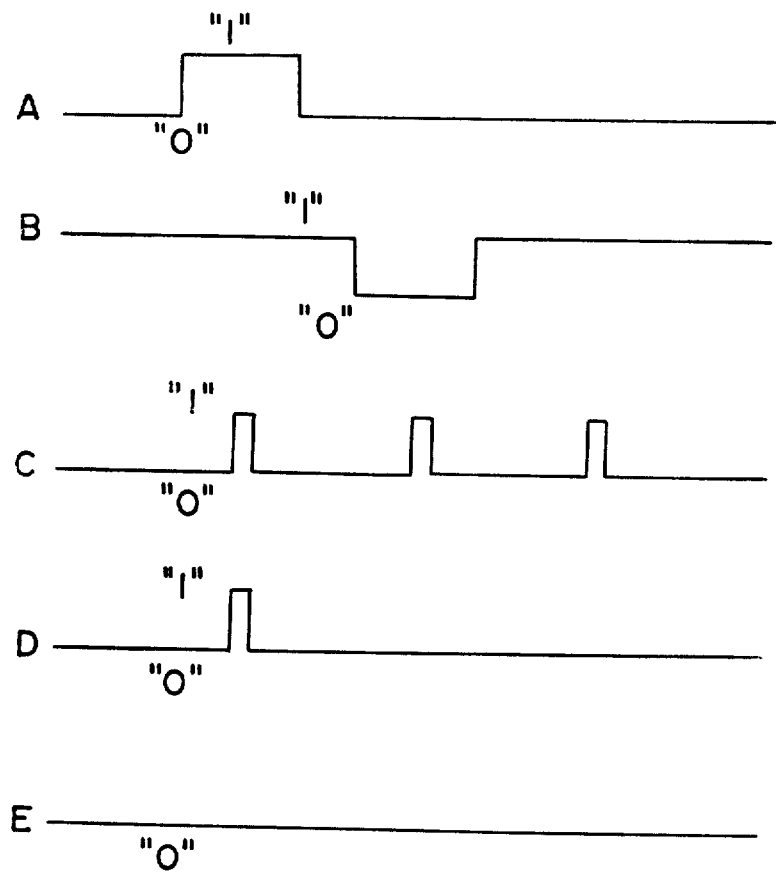
FIG. 4
FIG. 5
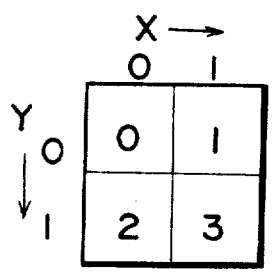
FIG. 6
| X | Y | ADDRESS |
|---|---|---------|
| 0 | 0 | 0 |
| 1 | 0 | 1 |
| 0 | 1 | 2 |
| 1 | 1 | 3 |

| X SIGNAL | Y SIGNAL | SIGNAL OF PART 8 |
|---|---|---|
| 0 | 0 | 0 |
| 1 | 0 | 1 |
| 0 | 1 | 1 |
| 1 | 1 | 1 |

METHOD OF INSPECTION OF SEMICONDUCTOR MEMORY DEVICE

BACKGROUND OF THE INVENTION

1. Field of the Invention

The present invention relates to a method of inspection of a semiconductor memory device, and is mainly directed to a method of inspection suitable for tests during the overall production of a semiconductor memory device and is applicable to general semiconductor memory devices.

2. Description of the Prior Art

With a variety of technical advances in semiconductor memory devices, the demand for semiconductor memory devices is increasing. Because of various use demands, it is important to shorten the period of development of a semiconductor memory device. In general, in the development of the semiconductor memory device, the design and manufacture take a period of about three months. Defects in design, especially in wiring, and defects in characteristics are inevitable in a product thus developed. Inspections for detecting defects are therefore carried out. The inspections are made not only for wiring checks, but naturally include tests on characteristics, such as supply voltage fluctuation tests, temperature tests, clock timing tests and cross-talk tests. Since the results of the tests are judged through write-in and read-out operations, defects in wiring particularly produce the same test result as does any other defect. Accordingly, the analysis of the defects becomes extremely complicated. It will be understood, in view of the above-mentioned period of development, that the precision of defect analysis greatly affects the period for developing a new product.

Since the semiconductor memory device has a large memory capacity amounting usually to 1 K-bits or greater to 2 K or 4 K bits, the write-in or read-out pattern for the inspection is massive. The pattern has hitherto involved continuous and repeated operations of several tens of program steps. It has, therefore, been impossible to prepare and use different test patterns for the respective defects. As a consequence, it has been unavoidable that the same defective part is detected over and over.

An example of the above-mentioned prior art type of inspection technique and an apparatus for accomplishing the same is illustrated in FIG. 3 of the drawings. This apparatus is commercially available and may be a Doctor -32 Memory Tester, manufactured by Adar Co. With reference to the drawings, a semiconductor memory device 1 includes a pair of decoders 3 and 4 for accessing a memory cell part 2. This is accomplished by the use of a microprogram part 7 which is connected by way of X-counter 5 and Y-counter 6 to the respective decoders 3 and 4. The microprogram part 7 provides a test pattern to be used in testing the memory cells.

As each semiconductor memory cell is accessed and tested, whether or not the same is a satisfactory cell or a defective one is judged by a judging part 12. The output of the judging part 12 is applied to one input terminal of AND gate 11. To another input of the gate timing pulses are supplied for gating out the output of the judging part 12 in accordance therewith to a fail memory 13.

In operation, during the inspection of one of the characteristics of the memory cell, for example, the inspection of the wiring thereof, let it be assumed that one of the cells has defective wiring so that the judging part 12 will provide a "1" level indicating a defective cell.

Now, with reference to FIG. 4, which illustrates the relationships between various signals supplied to the gate 11 and the output therefrom in the device shown in FIG. 3, where a particular cell has been detected to be defective, represented by a "1" signal, a signal A corresponding thereto, provided at the output of the judging part 12, indicates the same. With the coincidence of the timing pulse supplied to the other input of the gate 11 with the "1" level of signal A, for the particular memory cell being tested, the output of the gate 11 at that particular time will be a "1" as shown by signal D.

On the other hand, for a memory cell which passes the test involved such as the wiring test referred to above, the output of the judging part 12 will have a signal level "0" indicating a "good" or "acceptable" cell, so that for the synchronizing signal corresponding in time with that particular output, the AND gate 11 will receive a "0" and a "1" input simultaneously, so that its output will be a "0".

Thus, as each of the cells is tested and the judging part provides an output of the results of the tests, the fail memory 13 will be supplied with signals representative of the results of the tests for each respective cell, in synchronism with the timing pulses, for every test which is run on the cells. This means that where a plurality of testing operations are conducted for the memory cells, signals representative of the tests for each of the cells will be supplied to the fail memory 13.

One of the problems with this type of system is the fact that if, during an initial test, a cell has been found to be defective, it is still subsequently tested and the results thereof supplied to the fail memory for each of the subsequent tests thereby considerably complicating the process; also, additional time and storage space in the fail memory is required.

SUMMARY OF THE INVENTION

The present invention has been developed in order to eliminate the above problems, and has, as an object, the provision of a method and apparatus for inspecting semiconductor devices which facilitates the analysis of defects therein.

The basic configuration of the present invention involves an improvement on the above-referred to prior art system by providing a mask appointment part and a signal generating part which are coupled to X-counter 5 and the Y-counter 6 and are gated to the gate 11. By way of this additional circuitry, a mask instruction signal is coupled to the gate 11 so that when the address of the memory cell to be tested and the appointed address are coincident, a signal indicating the test result carried out on the cell is not supplied to the fail memory, but is masked by the mask instruction signal.

BRIEF DESCRIPTION OF THE DRAWINGS

FIG. 4 is a timing diagram for explaining the operation of the system of FIG. 3;

FIG. 5 is an address table for illustrating the identification of addresses in an exemplary arrangement of memory cells;

FIG. 6 illustrates a binary coding for the addresses of the cells shown in FIG. 5;

DETAILED DESCRIPTION

Figure 1:
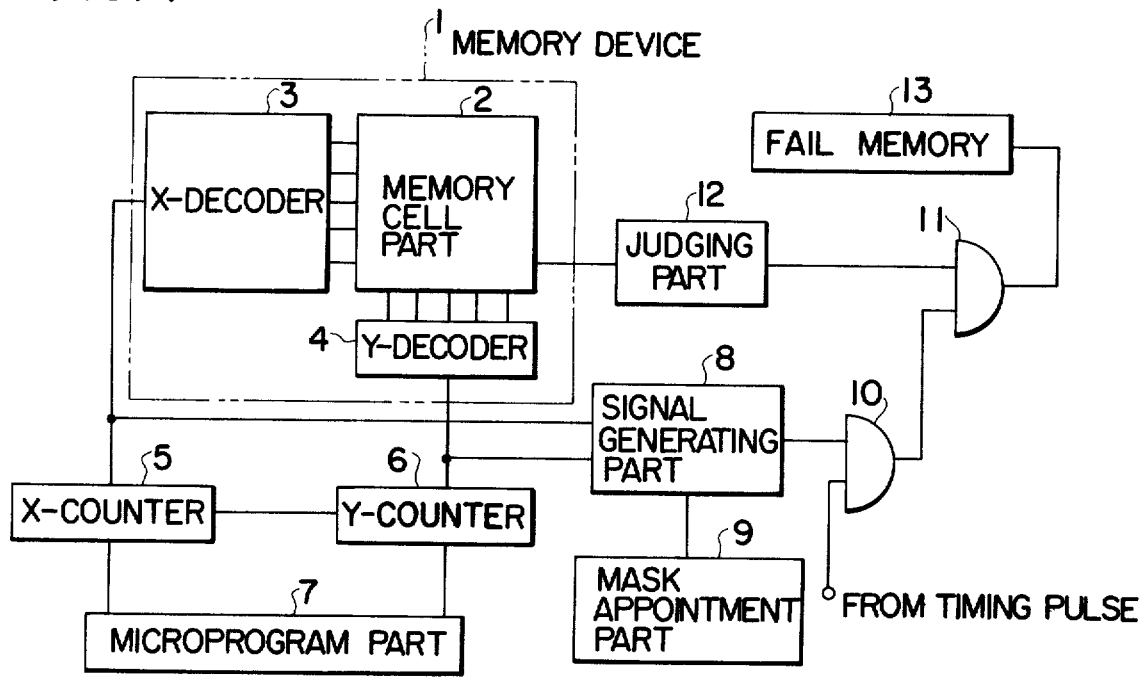
FIG. 1 is a block diagram of a circuit embodying the present invention.
Figure 3:
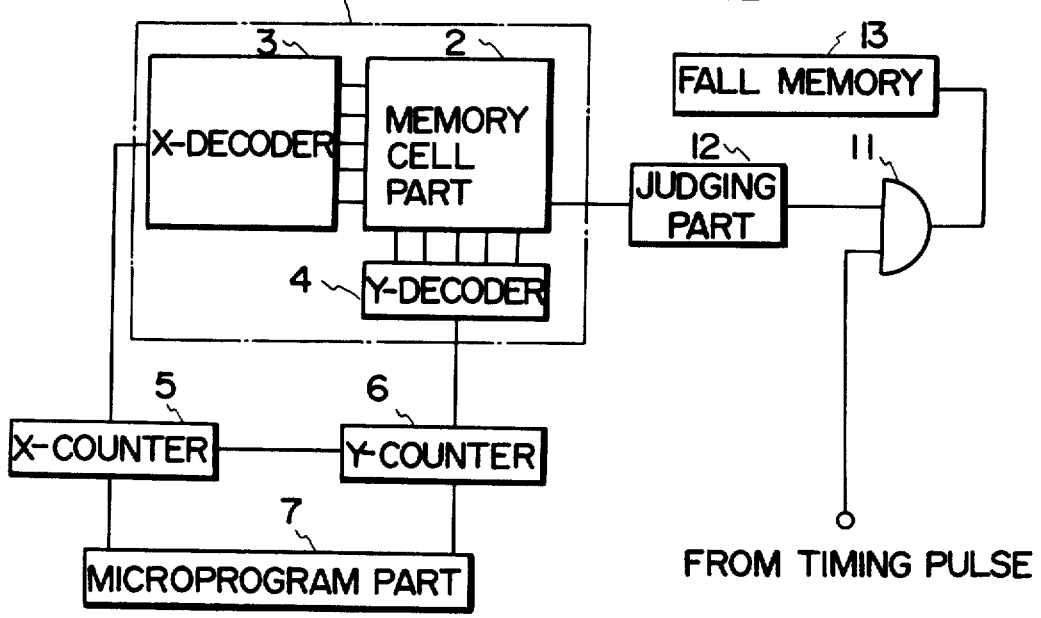
FIG. 3 is a block diagram of the above-referred to prior art system.

With reference now to FIG. 1, there is depicted a block diagram for explaining the present invention. In the figure, the same components referred to previously in connection with the prior art shown in FIG. 3 are illustrated and additional elements 8, 9 and 10 are also shown. More specifically, a mask signal generating part 8 is connected to the outputs of the X-counter 5 and the Y-counter 6 and generates a mask signal on the basis of the comparision and coincidence of the outputs of the mask appointment part 9 and the counters 5 and 6. The mask appointment part 9 generates a masking signal which is to be coupled to the gate 10, for masking a signal corresponding to a particular cell. The mask signal is applied to one input terminal of the AND gate 10, the output of which is coupled to an input terminal of the AND gate 11, in place of the direct connection of the synchronizing signal thereto, as in the case of the prior art shown in FIG. 3.

Depending upon whether or not the output signal from the judging part 12 indicates that the cell being tested is acceptable or defective, an appropriate signal therefrom will be delivered to the AND gate 11 to be supplied to the fail memory 13. Whether or not the signal is supplied to the fail memory 13 will depend upon whether or not that particular cell has been 'masked" by the mask appointment part 9.

Figures 7, 8:
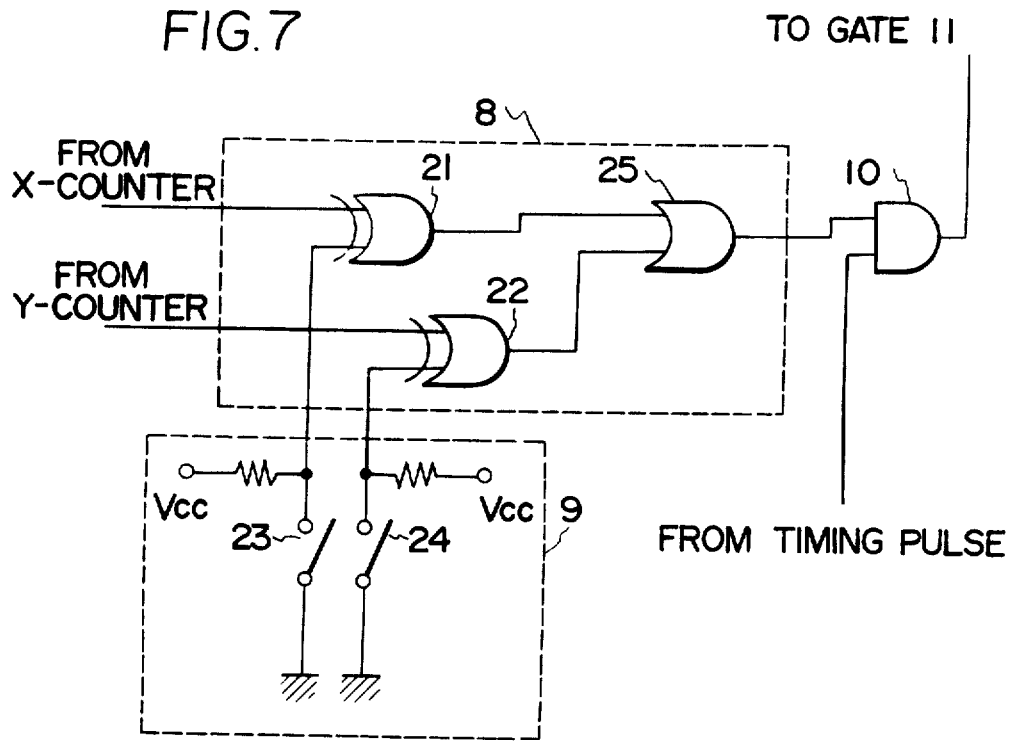
FIG. 7 is a detailed circuit diagram of the improvement provided by the present invention.
FIG. 8 is a table illustrating the relationship between the signals employed in FIG. 7.

FIG. 7 illustrates a detailed circuit diagram of the additional elements 8, 9 and 10, provided in accordance with the present invention and FIGS. 5, 6, and 8 illustrate the manner in which the particular cells are identified and signals supplied from the circuitry shown in FIG. 7.

For purposes of simplifying an illustration of the present invention, let it be assumed that the array of memory cells is a 2 × 2 array with respective addresses 0, 1, 2 and 3, as shown in FIG. 5. The binary indentification of the addresses for the respective X and Y row and column directions in which the cells are arranged is shown in FIG. 6. Of course, the number of cells in a memory device is ordinarily quite large and on the order of 1 K-bits, 2 K-bits, 4 K-bits, etc. FIG. 5 illustrates a 2 × 2 memory array, while FIG. 12 illustrates a 12 × 12 array with the x marks illustrating cells which have been tested to be defective from a characteristic standpoint, such as a wiring standpoint. Naturally, during subsequent testing operations, if the wiring is defective, the cells will check out to be defective as far as their voltage and temperature characteristics, for example, are concerned.

Figure 2:
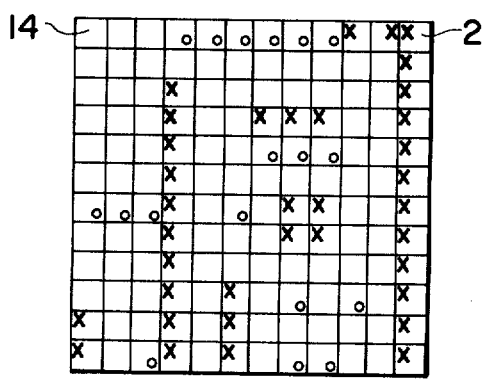
FIG. 2 illustrates an example of test results for a plurality of memory cells.

When running tests on the entire array of cells, where the outputs of the tests for all of the cells are displayed, the entire operation becomes quite complex when initially tested defective cells, as far as wiring is concerned, are later tested for other characteristics which may have passed the wiring test but are found to be defective e.g., as far as the voltage or temperature characteristics thereof are concerned, such as the cells indicated with the zero marks, shown in FIG. 2.

For the purposes of eliminating or "masking" signals which would be supplied to the fail memory 13 during the consecutive testing of the cells, a mask signal generating portion 8, shown in FIG. 7, includes a pair of exclusive OR gates 21 and 22 connected to an OR gate 25. The output of the OR gate 25 is connected as one input to the AND gate 10, the other input of which receives the synchronizing timing pules. The output of the AND gate 10 is connected to the AND gate 11, shown in FIG. 1. One of the inputs of the exclusive OR gates 21 and 22 is connected to a respective counter 5 or 6, while the other input thereof is connected to the mask appointment part 9, shown as being made of a pair of switches 23 and 24. When each switch is open, the exclusive OR gate which is connectable therewith will be supplied with a voltage level Vcc, whereas when the switches are closed, the input to the OR gate will change to the ground level, so that an effective "1" and "0" signal can be supplied to the OR gate depending upon whether the switch connected therewith is open or closed. Thus, for a simple 2 × 2 memory cell array, only two switches 23 and 24 are necessary for identifying the address of a particular memory cell which is to be masked.

With the circuit configuration shown in FIG. 8, let it be assumed that the cell with the address "zero," namely the cell in the upper left hand portion of FIG. 5, identified by the binary bits 00 has been detected to be a defective cell on the basis of an initial test. Normally, during the operation of the system, the judging part 12 would provide a signal indicating whether or not this cell is defective, and would do so repeatedly for each subsequent respective test. In order to mask the output of the judging part 12 and prevent it from being supplied to the fail memory 13 once that particular cell has been detected to be defective, the address of that cell is designated by the mask appointment part 9 by setting the switches 23 and 24 to their appropriate positions to provide a binary indication of the address of the cell in question. For the address "zero," each of the switches 23 and 24 will provide an output "0" so that one side of each of the exclusive OR gates 21 and 22 will receive a zero supplied thereto. As the counters 5 and 6 signal the decoders 3 and 4 in the memory device for testing the cell, when the address of the cell "zero" is designated for testing of the cell, the outputs of the counters will necessarily be "0" and "0" as shown in FIG. 6 for address "zero," so that the other inputs of the exclusive OR gates 21 and 22 will also be "0." Since the gates 21 and 22 are exclusive OR gates, the outputs thereof will not be a "1" level unless the inputs thereto differ. Namely, when the inputs to the exclusive OR gates are the same, the outputs thereof will necessarily be a "0," so that each time that the counters 5 and 6 indicate the address of a cell which has been masked by the setting of the switches in the mask appointment part, the exclusive OR gates within the signal generating part 8 will supply a zero output therefrom so that no signal will be supplied by way of a OR gate 25 to the AND gate 10. As a result, the timing pulses cannot pass through the AND gate 10 to be supplied to the gate 11, so that the output from the judging part 12 will not be supplied to the fail memory 13. As a result, the test results of the respective memory cells are supplied to the fail memory 13 only when not masked by the mask appointment part 9.

With this arrangement, therefore, it is possible to selectively mask any desired memory cell by merely changing the settings within the mask appointment part 9. As will be appreciated by those skilled in the art, the above illustration is simply for a 2 × 2 array and for a larger array of memory cells additional gates and input settings thereto would be provided. Since the construction of such arrays is readily understandable to those skilled in the art from the above description, a detailed explanation thereof is unnecessary.

Of course, while the above illustration refers to the masking of cells in which defective wiring characteristics have been detected, any suitable characteristic may be employed for the basis of the mask.

While we have shown and described one embodiment in accordance with the present invention, it is understood that the same is not limited thereto but is susceptible of numerous changes and modifications as known to a person skilled in the art and We therefore, do not wish to be limited to the details shown and described herein but intend to cover all such changes and modifications as are obvious to one of ordinary skill in the art.

We claim:

1. In a testing apparatus for detecting faults in a semiconductor memory array made up of a plurality of memory cells, each cell being capable of storing a binary bit of information, each cell being addressed by an X-address signal and a Y-address signal, said testing apparatus including:
   a. program means for generating a testing signal;
   b. X-counter means, controlled by said program means, for generating an X-address signal for the semiconductor memory array to be tested;
   c. Y-counter means, controlled by said program means, for generating a Y-address signal for the semiconductor memory array to be tested;
   d. judging means, coupled to said semiconductor memory array to be tested, for generating judgment signals representative of the results of the testing of a respective cell within said semiconductor memory array, addressed by said X-counter means and said Y-counter means;
   e. memory means, coupled to said judging means, for storing judgement signals representative of the results of the testing of a respective cell; and
   f. first gate means connected between said judging means and said memory means, for controllably coupling said judgment signals to said memory means;

the improvement comprising;
   g. mask appointment means for generating a masking signal representative of the address of a memory cell known to be defective;
   h. signal generating means, coupled to said X-counter means, said Y-counter means, and said mask appointment means, for comparing said masking signal with the X-address signals and Y-address signals by which the memory cells of the semiconductor memory array are addressed during the testing thereof, and for generating a mask signal upon coincidence of the masking signal with said X-address and Y-address signals; and
   i. second gate means, coupled between said signal generating means and said first gate means, and receiving a timing pulse, for inhibiting the transmission of said timing pulse to said first gate means, in response to the generation of a mask signal by said signal generating means.

2. The improvement according to claim 1, wherein each of said first and second gate means comprises a respective AND gate.

* * * * *